United States Patent
Maesaki et al.

[11] Patent Number: 6,161,117
[45] Date of Patent: Dec. 12, 2000

[54] WAVEFORM GENERATION DEVICE AND METHOD

[75] Inventors: Yoshihiro Maesaki; Hiroshi Teshigawara, both of Kanagawa, Japan

[73] Assignee: Fujitsu Limited, Kawasaki, Japan

[21] Appl. No.: 09/112,446

[22] Filed: Jul. 9, 1998

[30] Foreign Application Priority Data

Feb. 13, 1998 [JP] Japan .................................. 10-031352

[51] Int. Cl.[7] ...................................................... G06F 1/02
[52] U.S. Cl. .............................................................. 708/272
[58] Field of Search ................... 708/272, 270; 714/720

[56] References Cited

U.S. PATENT DOCUMENTS

| | | | |
|---|---|---|---|
| 3,237,157 | 2/1966 | Higby, Jr. ................ | 714/720 |
| 4,348,734 | 9/1982 | Dougherty ............... | 708/272 |
| 4,667,302 | 5/1987 | Mackey et al. .......... | 708/272 |
| 4,692,886 | 9/1987 | Miki et al. ............... | 708/272 |
| 4,701,872 | 10/1987 | Kitamura et al. ....... | 708/272 |
| 5,181,182 | 1/1993 | Urube et al. ............ | 708/272 |
| 5,258,937 | 11/1993 | Blackmon ................ | 708/272 |

FOREIGN PATENT DOCUMENTS

| | | |
|---|---|---|
| 60-125013 | 7/1985 | Japan . |
| 60-185425 | 9/1985 | Japan . |
| 7-325128 | 12/1995 | Japan . |
| 8-122408 | 5/1996 | Japan . |

*Primary Examiner*—David H. Malzahn
*Attorney, Agent, or Firm*—Arent Fox Kintner Plotkin & Kahn PLLC

[57] ABSTRACT

A waveform pattern file storage section is used for specifying a waveform pattern of a control signal, and storing waveform pattern bit strings formed from bits each of which specifies 1 logical state (an NRZ waveform). A waveform input section reads out the waveform pattern bit string. A waveform recognition section recognizes 1 cycle waveform pattern consisting of 3 consecutive bits in the waveform pattern bit string that has been read out. As a result, if an RZ waveform pattern has been recognized, an RZ waveform is generated with respect to the RZ waveform section; if an NRZ waveform pattern is recognized, an NRZ waveform is generated with respect to the NRZ waveform section.

4 Claims, 9 Drawing Sheets

| A6 | A5 | A4 | A3 | | A2 | A1 | A0 | |
|---|---|---|---|---|---|---|---|---|
| CAS LATENCY | | | | 0 SEQUENTIAL | BURST LENGTH | | | |
| 0 | 0 | 1 ← | 1 | | 0 | 0 | 0 ← | 1 |
| 0 | 1 | 0 ← | 2 | | 0 | 0 | 1 | 2 |
| 0 | 1 | 1 ← | 3 | | 0 | 1 | 0 | 4 |
| | | | ↑ CAS LATENCY | | 0 | 1 | 1 | 8 |
| | | | | | | | ↑ BURST LENGTH | |

(A)

BURST LENGTH : 1 ⟶ A9 : 1
BURST LENGTH : OTHER THAN 1 ⟶ A9 : 0

A7, A8 : FIXED AT 0

* REMAINING ADDRESS TERMINALS CAN BE SET TO EITHER 1 OR 0

WAVEFORM GENERATION DEVICE AND METHOD

BACKGROUND OF THE INVENTION

1. Field of the Invention

This invention relates to technology for dynamic burn-in testing of synchronous DRAM.

2. Description of the Related Art

Dynamic RAMs (referred to hereinafter as DRAMs) are being widely manufactured and sold as computer products become more widely used. To increase the reliability of DRAMs, it is important to test their lifetimes. When this is done, in order to shorten the testing time, in general an accelerated lifetime test called a burn-in test is performed.

In a burn-in test, power supply voltage and temperature corresponding to more severe conditions than will be encountered in actual use are applied to the DRAM, and the DRAM is operated for a fixed time. Then the operating performance of the DRAM is tested under these operating conditions just as is done in normal operation.

Specifically, during a burn-in test, it is necessary for data to be written in to an arbitrary address in the DRAM.

In conventional DRAM, this operation is determined by a combination of an RAS signal (a row address signal) and a CAS (a column address signal). When in normal mode, the address is specified and write-in or read-out is specified by changing the logical state of the RAS signal, then changing the logical state of the CAS signal.

However, when the mode is specified so that the logical state of the CAS signal is changed before the logical state of the RAS signal, the DRAM automatically goes into refresh mode. As a result, inside the DRAM the address value is automatically counted up from 0 to its maximum value, and refresh operation is executed. A mode such as this is called a CBR (CAS Before RAS) mode.

In burn-in testing of a conventional DRAM, the CBR mode described above is used. That is to say, during the burn-in test, by specifying a waveform pattern that combines an RAS signal with a CAS signal with respect to the conventional DRAM for the purpose of putting it into CBR mode, the conventional DRAM automatically goes into refresh mode. As a result, inside the conventional DRAM, the address value is automatically counted up from 0 to its maximum value, and access to all addresses is executed. In this way, a result equivalent to a test in which writing in was conducted to all addresses is obtained, and the burn-in test is completed.

Thus, it is possible to execute a burn-in test merely by specifying a fixed combined waveform pattern of an RAS signal and a CAS signal in order to put a conventional DRAM into CBR mode. That is to say, it is sufficient for the waveform pattern generating device used for the burn-in test to have a function that can generate a fixed waveform pattern, so it is not required to have complicated functions. Such a burn-in test, which is performed using a fixed waveform pattern, is generally called a static burn-in test.

Recently, synchronous DRAMs (abbreviated below as SDRAMs) have become the most common type of DRAM used, in place of conventional DRAMs.

An SDRAM is characterized by having its input/output and hold operation determined so as to be synchronized with a clock pulse applied to the clock pin. Specifically, whereas, in a conventional DRAM, data input and output are synchronized with timing determined by a combination of an RAS waveform and a CAS waveform as described above, in an SDRAM, the data are input and output continuously with timing synchronized with the clock pulse independently of the RAS signal and the CAS signal. In this way, in an SDRAM the data input/output operation can be executed faster than in a conventional DRAM.

However, in an SDRAM, when an operation is started, a precharge operation is firstly executed for all of the banks; then the following mode setting becomes necessary.

First it is necessary to set a burst length. As was stated above, in a conventional DRAM the operation timing is determined by the RAS signal and the CAS signal, so 100ns (nanoseconds) is necessary for each input or output. By comparison, in an SDRAM, as stated above, data can be input and output continuously on timing synchronized with the clock pulse. The number of data that are input or output in succession is called the burst length. In an SDRAM when the operation starts it is necessary to set this burst length in an internal register.

Next, a CAS latency setting is necessary. In an SDRAM, as stated above, data can be input or output continuously with timing synchronized with a clock pulse, so that there are cases in which the operation of the CPU and external devices cannot keep up with the operation of the SDRAM. In order to adjust for the difference in operation speeds between itself and external devices, the SDRAM can be set so that input and output are executed with a fixed delay with respect to the clock pulse. This delay value is called the CAS latency. In an SDRAM, when the operation starts this CAS latency must be set by means of an internal resistor.

Thus, in an SDRAM when the operation starts, precharging operation is executed for all of the banks; then it is necessary to set the burst length and the CAS latency. In addition, bank switching operation is also necessary.

The various initial settings and the bank switching described above are accomplished by feeding the specified RAS signal and the CAS specified signal corresponding to each state, specified address values, specified data values, etc. to the SDRAM.

Consequently, when a burn-in test is performed on an SDRAM, a static burn-in test such as would be performed on a conventional DRAM is inadequate; it becomes necessary to apply waveform patterns that change dynamically to each of the respective input/output pins and address pins of the SDRAM. This kind of burn-in test that is performed with a dynamically varying waveform pattern is generally called a dynamic burn-in test. In a burn-in test of an SDRAM, it is necessary to dynamically supply at least several tens of waveform patterns.

In order to perform this kind of dynamic burn-in test, in the past it has been necessary to use a waveform generation device that could dynamically generate all of the waveform patterns. In order to generate all of those waveform patterns, it was necessary for the waveform generating device to have the capability to flexibly generate both the well-known NRZ (non-return zero) waveforms and the well-known RZ (return zero) waveforms.

However, a waveform generating device that can dynamically generate both an NRZ waveform and an RZ waveform requires a capability to achieve complicated timing control, raising the problem that in general these devices are very expensive.

SUMMARY OF THE INVENTION

This invention was conceived against the background described above. Its purpose is to provide a waveform generating device that can dynamically generate NRZ waveforms and RZ waveforms, and do so at low cost.

This invention assumes the prior availability of a waveform generating device for the purpose of generating waveform patterns to be used in dynamic burn-in testing of synchronous DRAMs.

First, the pattern bit string storage section (the waveform pattern file storage section 101) stores the logical states of the 1 bit, as a pattern bit string, corresponding to each of a plurality of intervals into which a time band is divided (the NRZ waveform).

The waveform pattern bit string input section (the waveform reading section 102) reads the pattern bit string out from the pattern bit string storage section.

The waveform generating section (consisting of the waveform recognition section 103, the RZ waveform section 104 and the NRZ waveform section 105) generates the waveform corresponding to the bits corresponding to the continuous plurality of intervals (for example 3 bits) as the wavelength pattern for 1 cycle.

In the configuration of the invention described above, the pattern bit string storage section stores each of the pattern bit strings corresponding to a plurality of control signals; the waveform pattern bit string input section reads out in parallel each of the pattern bit strings corresponding to the plurality of control signals; the waveform generating section generates in parallel the respective waveforms corresponding to the plurality of control signals based on each of the pattern bit strings corresponding to the plurality of control signals that have been thus read out.

BRIEF DESCRIPTION OF THE DRAWINGS

The other purposes and the characteristics of this invention will be easily understood by one engaged in the profession from the attached drawings and the description of the preferred embodiments.

FIG. 7 shows the CAS latency and burst length setting specifications.

DESCRIPTION OF THE PREFERRED EMBODIMENTS

Figure 1:
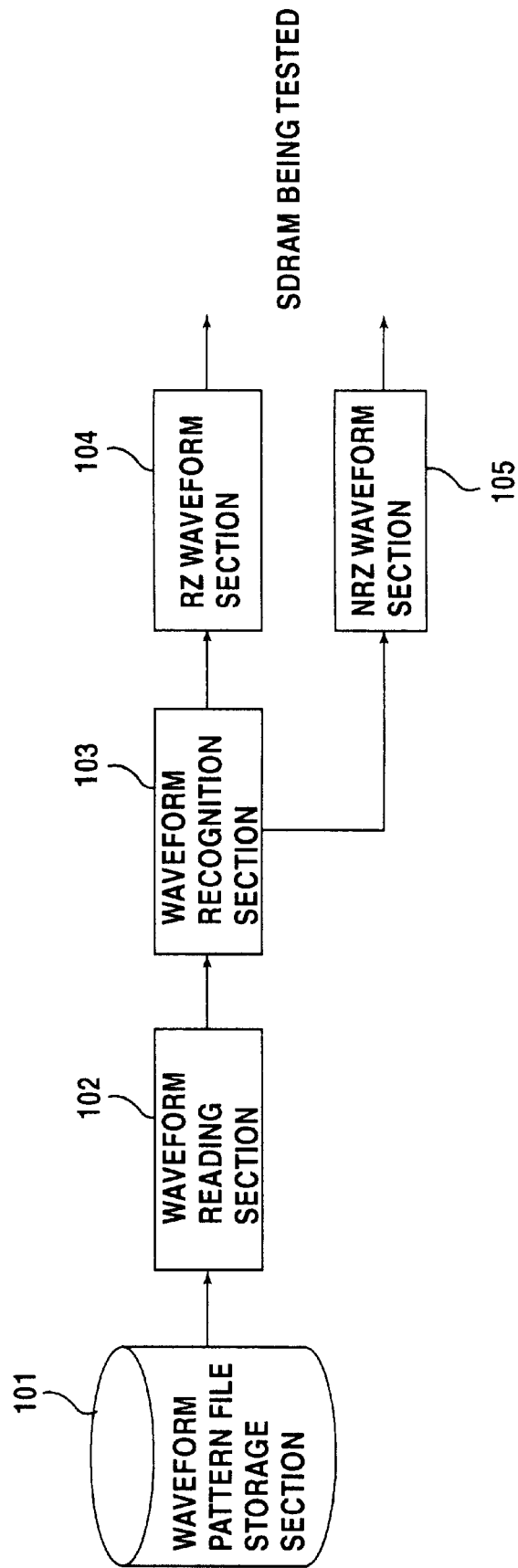
FIG. 1 is a configuration diagram of a preferred embodiment of this invention.

Now we will describe the preferred embodiments of this invention in detail, referring to the drawings.

This invention is characterized by its ability to use a waveform generating device that has a capability of generating only NRZ waveforms, such as are generally used in tests of linear system integrated circuits and TTL integrated circuits, to also dynamically generate RZ waveforms.

FIG. 1 is a configuration diagram of a preferred embodiment of this invention.

The waveform pattern file storage section 101 and the waveform input section 102 can use an existing NRZ waveform generating device as is. The waveform pattern file storage section 101 stores a waveform pattern file that contains waveform pattern bit strings for the purpose of specifying the waveform patterns of the respective control signals. The waveform input section 102 can read out the waveform pattern file that is stored in the waveform pattern file storage section 101, and input in parallel these waveform pattern bit strings for the plurality of control signals.

Here, the waveform pattern bit string consists of 1 bit that specifies the logical states of 1 cycle of the NRZ waveform. The NRZ waveform is the type of waveform of which the logical state does not change within 1 cycle, so the logical state of 1 cycle can be expressed by 1 bit.

A preferred embodiment of this invention has the characteristic that 1 bit of the waveform pattern bit string is not used as the output waveform for 1 cycle, but instead 3 bits of that waveform pattern bit string are used as the output waveform of 1 cycle.

For example, the clock pulse waveform applied to an SDRAM clock terminal (abbreviated below to the CLK terminal) is a typical RZ waveform in which the logical state varies within 1 cycle. In this preferred embodiment of this invention, as shown in FIG. 2(a) the positive pulses corresponding to 1 cycle of the clock pulse waveform are expressed by a waveform pattern bit string that could express 3 cycles of an NRZ waveform, for example "0", "1", "0".

Figure 2:
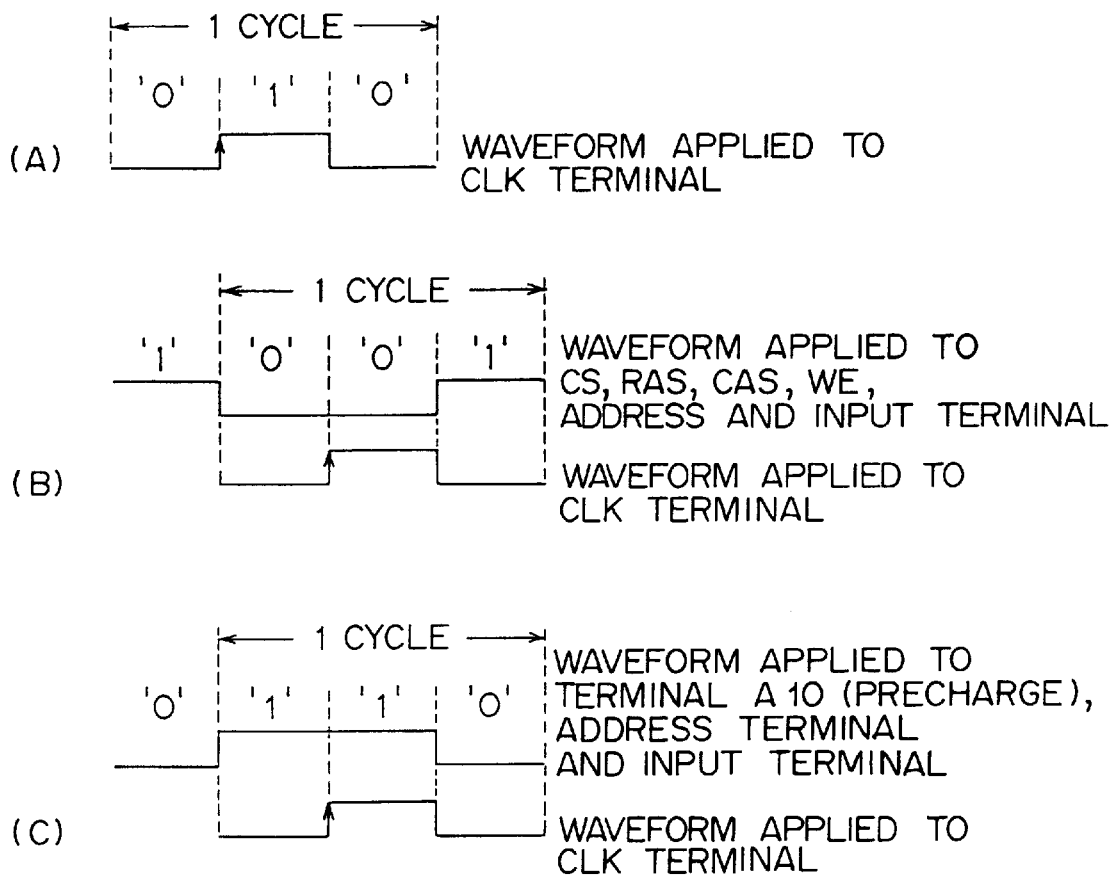
FIG. 2 is a diagram that explains the operation by which an RZ waveform is generated from an NRZ waveform in the preferred embodiment of this invention.

Similarly, as shown in FIG. 2(b), the negative pulses corresponding to 1 waveform cycle that are applied to the chip selection terminal (abbreviated below as the CS terminal), the RAS signal terminal, the CAS signal terminal and the write enable terminal (abbreviated below as the WE terminal) are expressed by a waveform pattern bit string such as "0", "0", "1" that could specify 3 cycles of an NRZ waveform.

In this case, in order to secure the setup timing and the hold timing, as shown in FIG. 2(b) the waveform pattern bit string that generates the waveform that is applied to the CLK terminal is synchronized with the waveform pattern bit string that generates the waveforms that are applied to the CS, RAS, CAS and WE terminals, and input by the waveform input section 102, so that the timing of the rise of the clock waveform that is applied to the CLK terminal will be positioned in the center of the active interval of the negative pulse.

In addition, similarly, the positive pulse constituting 1 cycle of the waveform that is applied to terminal A10 (precharge) is, as shown in FIG. 2(c), expressed by a waveform pattern bit string that specifies 3 cycles of an NRZ waveform, namely, "1", "1", "0".

In this case, in order to secure the setup timing and the hold timing, as shown in FIG. 2(c), the waveform pattern bit string that generates the waveform that is applied to the CLK terminal is synchronized with the waveform pattern bit string that generates the waveform that is applied to the terminal A10 and input by the waveform input section 102 so that the timing of the rise of the clock waveform that is applied to the CLK terminal will be positioned in the center of the active interval of the positive pulse.

Both the negative pulse shown in FIG. 2(b) and the positive pulse shown in FIG. 2(c) are specified as 1 cycle waveforms that are applied to the address terminal and the input terminal.

In FIG. 1, every time a control signal arrives the waveform recognition section 103 recognizes the logical state of the waveform pattern bit string input by the waveform input section 102 with 3 cycles taken as the unit, as explained above.

As a result, when a positive pulse or negative pulse RZ waveform is specified by 3 cycles of a waveform pattern bit string as shown in FIGS. 2(a) to (c), the waveform recognition section 103 specifies output of an RZ waveform pulse corresponding to them to the RZ waveform section 104.

If an NRZ waveform such that the logical state does not vary among the 3 cycles is specified by the 3-cycle waveform pattern bit string, the waveform recognition section 103 specifies output of an NRZ waveform pulse corresponding to it to the NRZ waveform section 105 is specified.

In this case, the RZ waveform section 104 and the NRZ waveform section 105 control the output timing so that the readout time of the 3-cycle waveform pattern bit string by the waveform input section 102 becomes the time specified for 1 cycle with respect to the SDRAM being tested.

In the preferred embodiment of this invention configured as described above, the existing waveform pattern file storage section 101 and waveform input section 102 that have been provided for generating NRZ waveforms can be used as they are to generate dynamically varying RZ waveforms.

Figure 3:
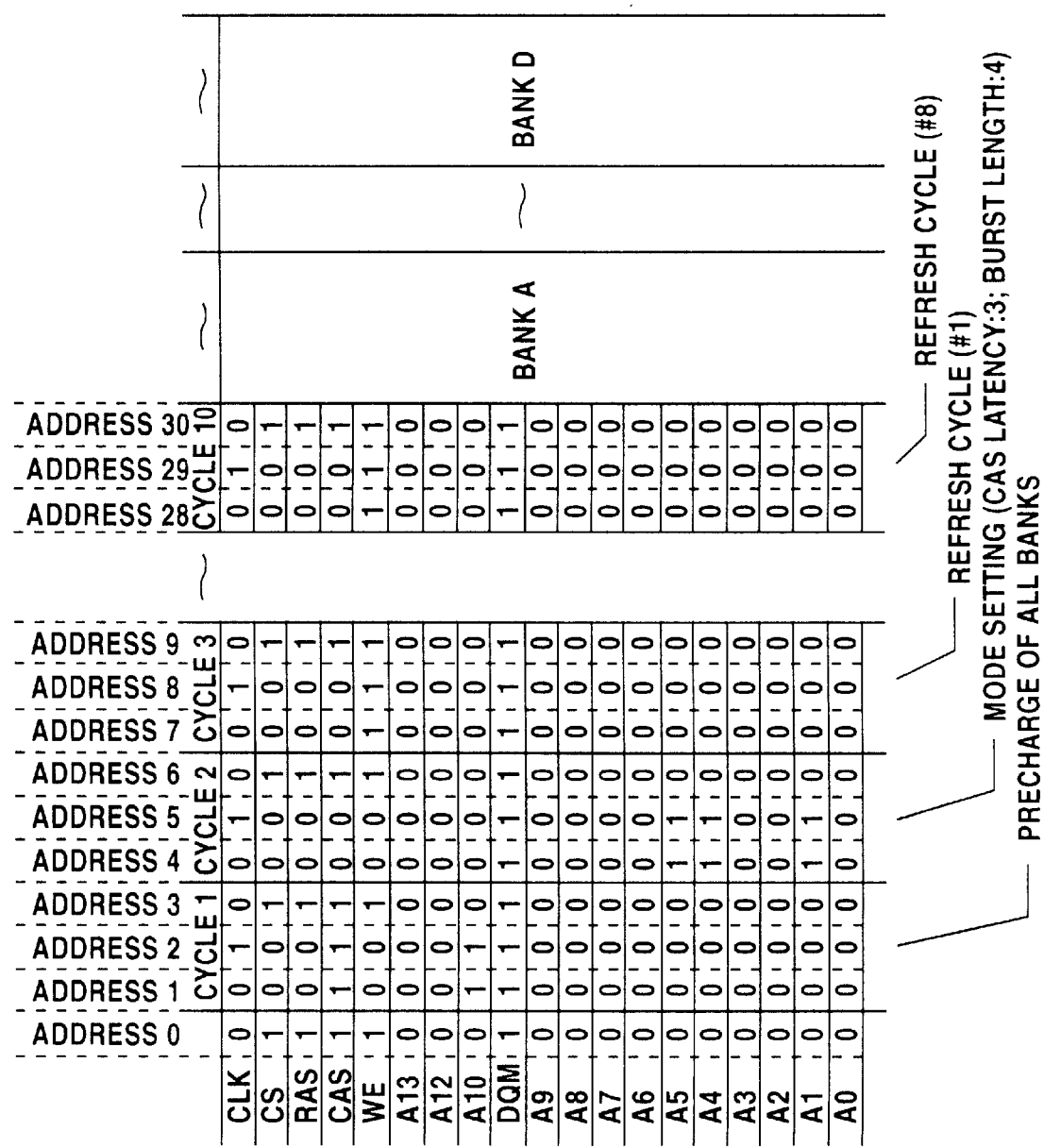
FIG. 3 an example of waveform pattern file composition.
Figure 4:
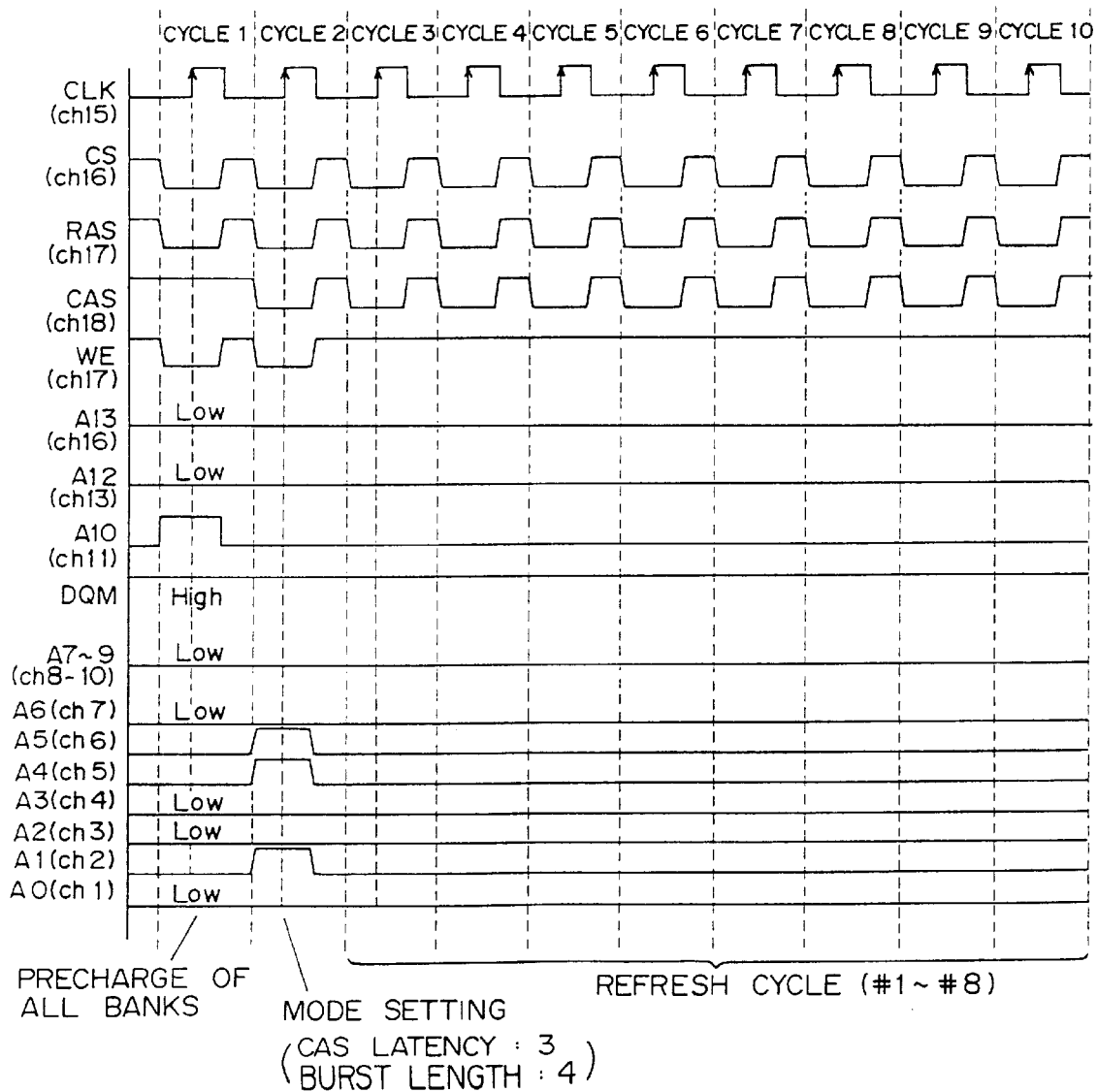
FIG. 4 is a timing diagram of the operation of waveform generation in a dynamic burn-in test of an SDRAM (1 of 3).
Figure 5:
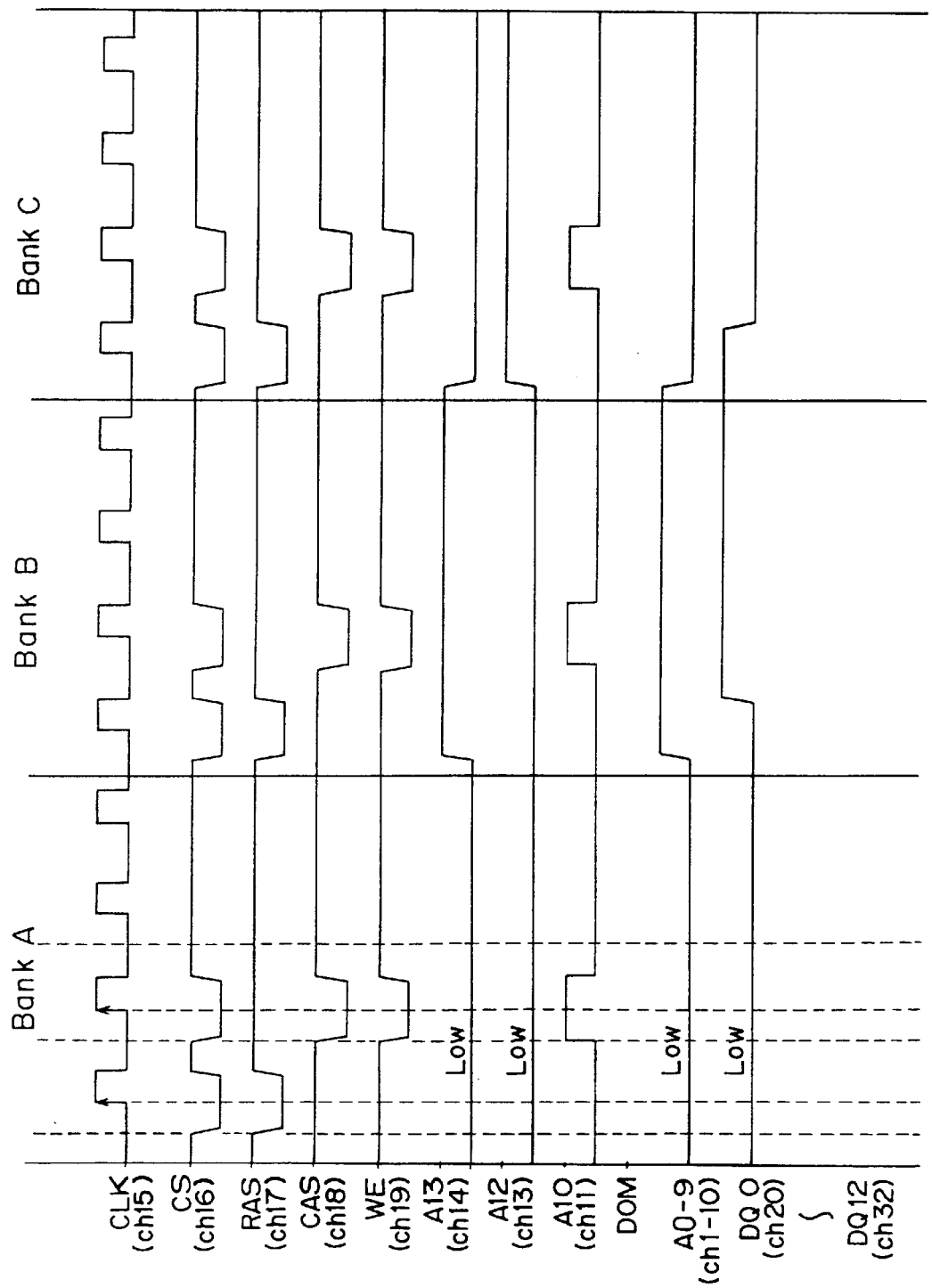
FIG. 5 is a timing diagram of the operation of waveform generation in a dynamic burn-in test of an SDRAM (2 of 3).
Figure 6:
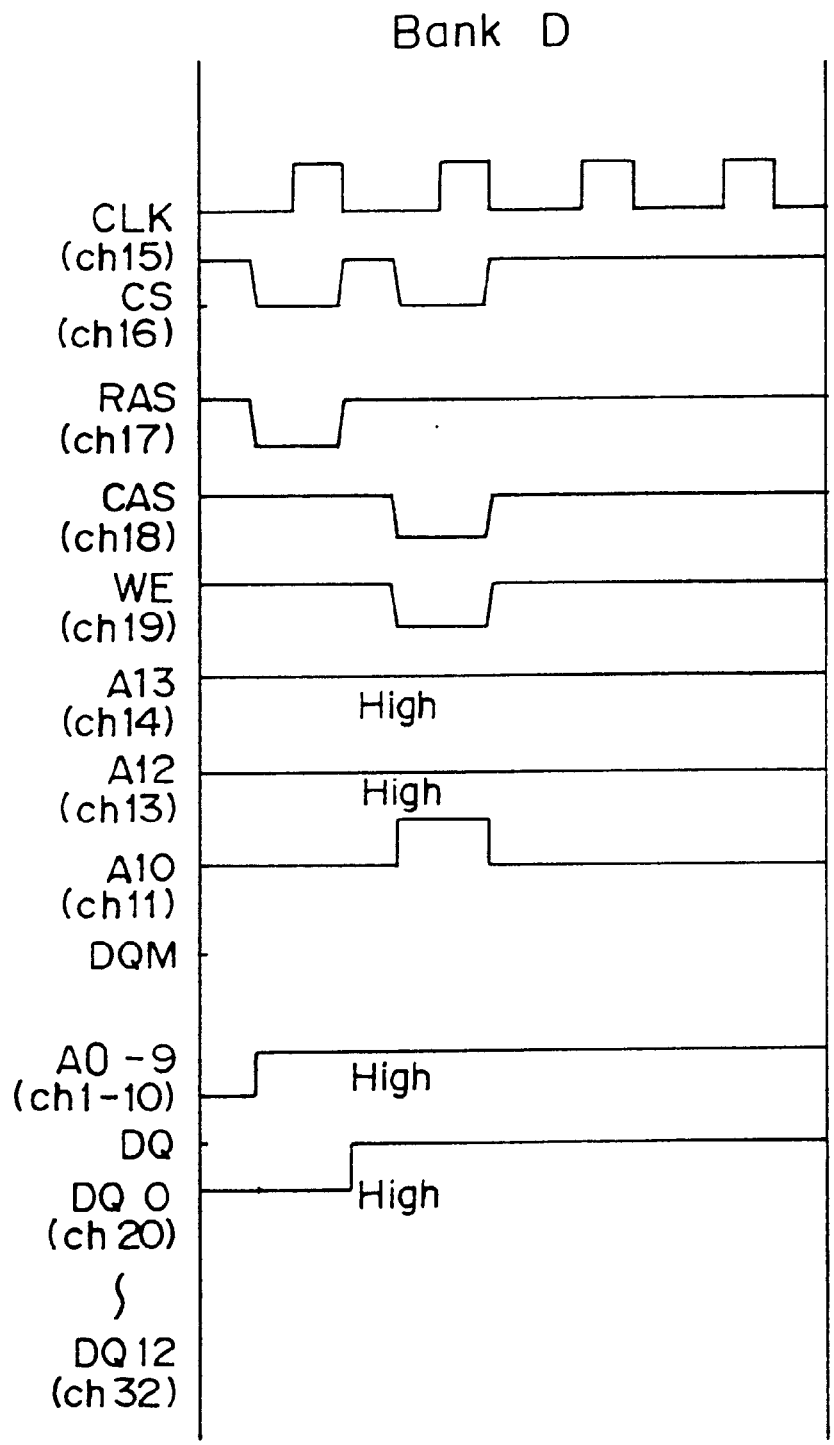
FIG. 6 is a timing diagram of the operation of waveform generation in a dynamic burn-in test of an SDRAM (2 of 3).

FIG. 3 shows an example of the data configuration of a waveform pattern file that stores a waveform pattern bit string for every control signal and is stored in the waveform pattern file storage section 101. FIGS. 4 to 6 are dynamic timing charts of the waveforms generated in a dynamic burn-in test of an SDRAM using a waveform pattern file that has the data configuration shown in FIG. 3.

In FIG. 3, the information of 1 bit that specifies the logical state of 1 cycle NRZ waveforms is stored for 1 address 1; the number of bits stored corresponds to the plurality of control signals. For each control signal, every time the bit strings stored in 3 addresses are read out, a cycle 1 waveform pattern corresponding to those 3 bits is generated.

For example, the cycle 1 waveform group shown in FIG. 4 is generated to precharge all banks of the SDRAM by the waveform pattern bit string in addresses 1 to 3 shown in FIG. 3.

Specifically, the positive pulse that is the 1 cycle RZ waveform shown in FIG. 4 is generated by the waveform pattern bit string "0", "1", "0" read out from addresses 1 to 3 shown in FIG. 3 as the clock waveform to be applied to the CLK terminal.

In addition, the 3 negative pulses which are the RZ waveforms shown in FIG. 4 are generated by the group of 3 waveform pattern bit strings "0", "0", "1" read out from addresses 1 to 3 shown in FIG. 3 as the clock waveforms to be applied to the CS terminal, the RAS terminal and the WE terminal.

Further, the positive pulse that is the cycle 1 RZ waveform shown in FIG. 4 is generated by the waveform pattern bit string "1", "1", "0" read out from addresses 1 to 3 shown in FIG. 3, as the clock waveform to be applied to terminal A10 (precharge).

The cycle 1 NRZ waveforms shown in FIG. 4 are generated by the group of waveform pattern bit strings "0", "0", "0" or the group of waveform pattern bit strings "1", "1", "1" read out from addresses 1 to 3 shown in FIG. 3 as the clock waveforms to be applied to the remaining terminals.

A precharge test of all banks of the SDRAM being tested is performed by the waveforms.

Next, the cycle 2 waveform group shown in FIG. 4 is generated by the waveform pattern bit string stored in addresses 4 to 6 shown in FIG. 3 in order to perform the SDRAM mode settings (the CAS latency and burst length settings).

Here, as shown in FIG. 7 when the bit pattern "0", "0", "1" is specified at the address terminals A6, A5 and A4, the CAS latency is set to 1; when the bit pattern is specified as "0", "1", "0" the CAS latency is set to 2; when the bit pattern is specified as "0", "1", "1" the CAS latency is set to 3.

In addition, when the bit pattern "0", "0", "0" is specified at the address terminals A2, A1, A0 shown in FIG. 7 the burst length is set to 1; when the bit pattern is specified as "0", "1", "1" the burst length is set to 2; when the bit pattern is specified as "0", "1", "0" the burst length is set to 4; when the bit pattern is specified as 0", "1", "1" the burst length is set to 8. When the burst length is set to 1, address terminal A9 is set to "1"; when the burst length is set to a value other than 1, address terminal A9 is set to "0".

In the mode settings described above, a specification of "0" for the sequential operation is set at the address terminal A3. Address terminals A7 and A8 are fixed at "0". The remaining address terminals can be set to either "1" or "0".

In the waveform pattern bit string in addresses 4 to 6 shown in FIG. 3, in address 5, where the logical state of the CLK terminal becomes active ("1"), the bit pattern "0!, "1", "1" is specified for the address terminals A6, A5, A4; also, the bit pattern "0", "1", "0" is specified for the address terminals A2, A1, A0, so, from FIG. 7, 3 is set as the CAS latency and 4 is set as the burst length.

Specifically, the positive pulse that is the cycle 2 RZ waveform shown in FIG. 4 is generated by the waveform pattern bit string "0", "1", "0" read out from addresses 4 to 6 shown in FIG. 3 as the clock waveform to be applied to the CLK terminal.

In addition, the 3 negative pulses that are the cycle 2 RZ waveform shown in FIG. 4 are generated by the group of 3 waveform pattern bit strings "0", "0", "1" read out from addresses 4 to 6 shown in FIG. 3, as the clock waveforms to be applied to the CS terminal, the RAS signal terminal and the CAS signal terminal.

The cycle 2 NRZ waveforms shown in FIG. 4 are generated by the group of waveform pattern bit strings "0", "0","0"or "1", "1", "1" read out from addresses 4 to 6 shown in FIG. 3 as the clock waveforms to be applied to the remaining terminals.

The CAS latency and burst length mode setting test is performed on the SDRAM being tested by the waveforms discussed above.

After the initial setting operations described above, the cycle 3 to 10 repeat waveform groups shown in FIG. 4 to secure the 8 refresh cycles prescribed for the SDRAM being tested by the waveform pattern bit strings in groups of 3 addresses at a time for cycles 3 to 10 as shown in FIG. 3.

Then, although this is not shown in FIG. 3, the groups of waveforms shown in FIG. 5 and FIG. 6 are generated to perform data write-in tests on each bank (Bank A to Bank D) in the SDRAM being tested.

Figure 8:
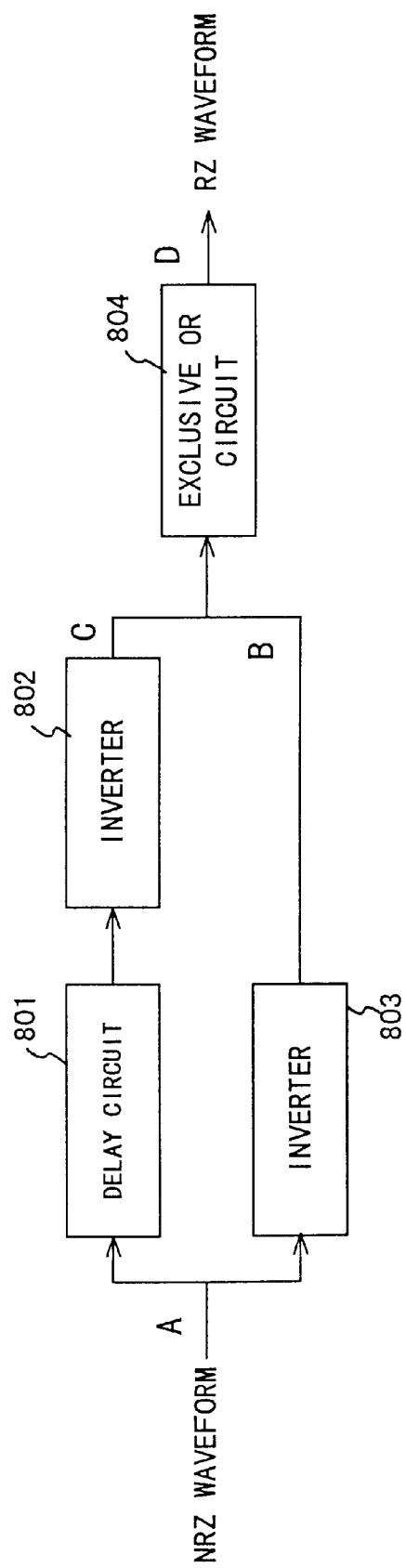
FIG. 8 shows an example of configuration of an RZ waveform section.

FIG. 8 shows an example of a specific configuration of the RZ waveform section shown in FIG. 1.

Figure 9:
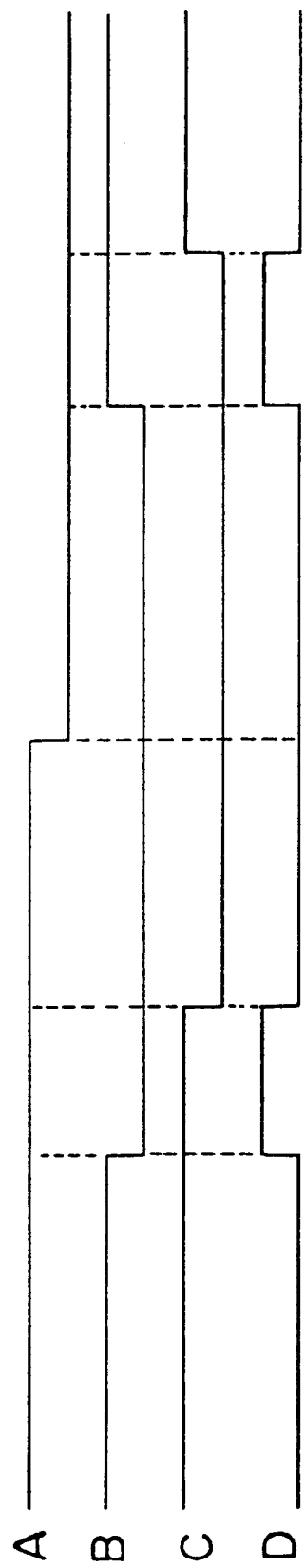
FIG. 9 is a timing diagram of the operation of the waveform generated by the configuration shown in FIG. 8.

As shown in FIG. 9, when the NRZ waveform A, in which the logical states "1" and "0" are repeated for each cycle, is input, the waveform B shown in FIG. 9 is generated from the inverter 803, and the waveform C shown in FIG. 9 is generated from the delay circuit 801 and the inverter 802.

Then the exclusive OR circuit 804 generates the positive pulse D, that is the RZ waveform shown in FIG. 9, by forming the exclusive OR of the above-mentioned 2 waveforms B and C.

In this case, an RZ waveform pulse is generated with arbitrary timing and duty ratio by controlling the delay time, etc., in the delay circuit 801.

The period of the RZ waveform that is thus formed is shortened to ⅓ of its original length, and then it is output.

To output a negative pulse it is sufficient to connect an inverter immediately before the exclusive OR circuit 804.

What is claimed is:

1. A waveform generating device for generating waveform patterns to be used in dynamic burn-in testing of synchronous dynamic random access memories (SDRAMs), comprising:

a pattern bit strings storing unit storing pattern bit strings corresponding to each of a plurality of control signals for the dynamic burn-in testing, each bit constituting the pattern bit string corresponding to one cycle of a non-return zero (NRZ) waveform;

a pattern bit string reading unit reading pattern bit strings out from said pattern bit strings storing unit; and a waveform generating unit generating non-return zero (NRZ) and return zero (RZ) waveforms corresponding to said plurality of control signals, one cycle of the waveforms corresponding to a plurality of consecutive bits in the pattern bit string that has been read out.

2. A waveform generating device as described in claim 1, wherein;

said pattern bit string reading unit reads pattern bit strings corresponding to said plurality of control signals out in parallel; and said waveform generating unit generates NRZ and RZ waveforms corresponding to said plurality of control signals in parallel, based on respective pattern bit strings, corresponding to the plurality of control signals, that have been read out.

3. A waveform generating device as described in claim 1, wherein said waveform generating unit generates NRZ and RZ waveforms, one cycle of the waveforms corresponding to three consecutive bits in the pattern bit string that has been read out.

4. A waveform generating method for generating waveform patterns to be used in dynamic burn-in testing of synchronous dynamic random access memories (SDRAMs), comprising:

storing pattern bit strings corresponding to each of a plurality of control signals for the dynamic burn-in testing, each bit constituting the pattern bit string corresponding to one cycle of a non-return zero (NRZ) waveform;

reading out the stored pattern bit strings; and generating non-return zero (NRZ) and return zero (RZ) waveforms corresponding to said plurality of control signals, one cycle of the waveforms corresponding to a plurality of consecutive bits in said pattern bit string that has been read out.

\* \* \* \* \*